United States Patent [19]

Chang

[11] Patent Number: 4,778,562

[45] Date of Patent: Oct. 18, 1988

[54] REACTIVE ION ETCHING OF TIN OXIDE FILMS USING NEUTRAL REACTANT GAS CONTAINING HYDROGEN

[75] Inventor: Shih-Chia Chang, Troy, Mich.

[73] Assignee: General Motors Corporation, Detroit, Mich.

[21] Appl. No.: 639,853

[22] Filed: Aug. 13, 1984

[51] Int. Cl.$^4$ .................. B44C 1/22; C03C 15/00; C03C 25/06; C23F 1/02

[52] U.S. Cl. ............................ 156/643; 156/646; 156/655; 156/659.1; 156/667; 204/192.35; 252/79.1

[58] Field of Search ............ 156/643, 646, 653, 655, 156/656, 657, 659.1, 667; 427/38, 39; 204/164, 192 E, 192.35; 252/79.2, 79.1

[56] References Cited

U.S. PATENT DOCUMENTS

| | | | |
|---|---|---|---|
| 4,207,137 | 6/1980 | Tretola | 156/627 |
| 4,208,241 | 6/1980 | Harshbarger et al. | 156/643 |
| 4,211,601 | 7/1980 | Mogab | 156/643 |
| 4,226,665 | 10/1980 | Mogab | 156/643 |
| 4,253,907 | 3/1981 | Parry et al. | 156/643 |
| 4,256,534 | 3/1981 | Levinstein | 156/643 |
| 4,259,145 | 3/1981 | Harper et al. | 156/643 |
| 4,277,304 | 7/1981 | Horiike et al. | 156/643 |
| 4,285,763 | 8/1981 | Coldren | 156/643 |
| 4,310,380 | 1/1982 | Flamm et al. | 156/643 |
| 4,312,732 | 1/1982 | Degenkolb et al. | 204/192 E |
| 4,361,461 | 11/1982 | Chang | 156/643 |
| 4,373,990 | 2/1983 | Porter | 156/643 |
| 4,384,938 | 5/1983 | Desilets et al. | 156/643 X |
| 4,414,069 | 1/1984 | Cuomo | 204/192 E |
| 4,424,102 | 1/1984 | Brandeis et al. | 204/192 E |

OTHER PUBLICATIONS

Hayashi et al., "Sputter Etching of the Film", *Japan, J. Appl. Phys.*, vol. 12 (1973), No. 9, p. 1457.

Balige et al., "Electrochemical Patterning of Tin Oxide Films", *Journal of the Electrochemical Society*, vol. 124, No. 7, pp. 1059-1060, Jul. 1977.

Dionex Gas Plasma Systems Advertising brochure.

*Chemical Abstracts*, Citation 98:64240j, "Mirofabrication of Tin Oxide Film".

*Chemical Abstracts*, Citation 98:26283t, "Etching of Transparent-Conductor Film", p. 612.

*Chemical Abstracts*, Citation 98:2628w, "Conductive Thin Film", p. 612.

*Chemical Abstracts*, Citation 98:44964n, "Nonisothermal Plasma Etching of Stannic Oxide Film."

*Primary Examiner*—William A. Powell
*Attorney, Agent, or Firm*—Robert J. Wallace

[57] ABSTRACT

High resolution patterns can be etched in tin oxide films in one step using reactive ion etching when the reactant gas consists substantially of nitrogen and/or argon and from small but effective amounts of hydrogen up to about 10 percent by volume hydrogen.

5 Claims, No Drawings

REACTIVE ION ETCHING OF TIN OXIDE FILMS USING NEUTRAL REACTANT GAS CONTAINING HYDROGEN

FIELD OF THE INVENTION

This invention relates to the etching of tin oxide coatings. More specifically, it relates to reactive ion etching of very high resolution patterns in thin films of tin oxide.

BACKGROUND OF THE INVENTION

Liquid phase, i.e., wet, chemical etching is a typical technique for delineating patterns in blanket coatings. However, where higher resolution patterns are involved, gas phase chemical etching has become of greater interest. Gas phase chemical etching can be accelerated by forming a plasma of the reactant gas at low pressure. However, techniques such as the latter still involve etching by chemical reaction. In addition, if the by-products of the chemical reaction are not volatile under the low pressure conditions, a second etching step may be required to remove them. In some instances one may even need to repeat the first and second steps a multiplicity of times to etch completely through a coating.

Tin oxide is a difficult material to etch. It is resistant to attack by many liquid chemicals, requiring special procedures to etch it. For example, one can etch it with nascent hydrogen that is produced by dissolution of zinc in hydrochloric acid. In such a technique the nascent hydrogen reduces the tin oxide to free tin, which is then removed by reaction with additional hydrochloric acid not reacted with the zinc. Such an etching procedure does not produce good resolution and is difficult to control. Electrochemical etching, using a platinum counterelectrode and a hydrochloric acid electrolyte, is generally unsatisfactory in that it has a tendency to leave unetched patches. Sputter etching is not an acceptable alternative because of non-selectivity and low etch rates.

Tin oxide has previously been plasma etched using a hydrogen as the reactant gas. However, the reaction leaves a residue, probably free tin, in the etched areas that has to be etched off with an acid solution. Use of the acid solution, of course, limits the resolution obtainable. A chlorinated gas such as hydrogen chloride or boron trichloride could be substituted for the hydrogen. However, such gases are considered toxic and/or corrosive, and the etching still must be conducted in two steps, as with the hydrogen plasma etching.

On the other hand, I have found that tin oxide can be readily etched in one step by reactive ion etching if the reactant gas consists substantially of argon or nitrogen containing a small proportion of hydrogen. Moreover, this reactant gas is quite selective for tin oxide, in that it does not readily attack commercially available organic resists, as for example, Shipley's AZ 1350 J, Phillip Hunt Chemical Company's HPR204 and Kodak's 747. Further, the etchant gas does not form polymers when used that contaminate the vacuum system. Still further, the reactant gas does not interact with the masking resist in such a way as to make it more difficult to remove after etching is completed. After etching with my technique, resists can be readily removed by conventional techniques, as for example, removal by oxygen plasma or simply by rinsing with acetone. Accordingly, extremely high resolution, i.e., narrow width lines, can be etched. Since my technique does not produce significant undercutting, I refer to my technique as being highly anisotropic in character.

It should also be noted that the improvements of the technique of this invention are quite similar to those of the technique covered by my concurrently filed U.S. patent application Ser. No. 640938 (D-8546), U.S. Pat. No. 4,544,444 entitled "Reactive Ion Etching of Tin Oxide Films Using Silicon Tetrachloride Reactant Gas" and assigned to the assignee hereof.

OBJECTS AND SUMMARY OF THE INVENTION

It is an object of this invention to provide an improved method for etching tin oxide films.

This invention comprehends using a reactant gas consisting substantially of a neutral gas such as nitrogen and/or argon and containing a small proportion of hydrogen, for reactive ion etching of tin oxide films. By reactive ion etching, I mean a process of simultaneously not only exposing the tin oxide film to a chemical reaction with plasma of the reactant gas, but also exposing it to a significant ion bombardment, wherein etching is not only due to a chemical interaction with the plasma, but also due to a significant momentum transfer between ions of the plasma and atoms of the film.

DESCRIPTION OF THE PREFERRED EMBODIMENTS

In one specific example of this invention, a 300 nanometer thick tin oxide sputtered film was overcoated with Shipley's resist AZ 1350 J. The resist was exposed and developed to uncover a predetermined surface pattern of the tin oxide. As so prepared, the tin oxide sample was placed on the negative electrode in the etching, or vacuum, chamber of a conventional reactive ion etching apparatus, Model No. MRC V4-8500, which is commercially available from Materials Research Corporation of Orangeburg, N.Y.

It should be recognized that the power supply of a reactive ion etching apparatus differs from a plasma etching apparatus. Its rf voltage supply not only provides a sufficient rf voltage between vacuum chamber electrodes to establish a plasma of the reactant gas, but also to produce a significant DC bias between them. The DC bias is sufficient to accelerate plasma atoms to the surface of the negative electrode, where the sample is supported, with sufficient velocity to provide a sputtering action at the sample surface in addition to the enhanced chemical reaction activity provided by the plasma itself. The DC bias can be provided by superimposing a DC potential on the rf potential used to form the plasma, or by controlling the rf wave form to yield a net negative potential on the negative electrode.

Except for using my distinctive reactant gas, the reactive ion etching apparatus was operated in accordance with the normal and accepted procedure recommended by the manufacturer. For example, the sample was placed on the negative electrode, or cathode, which was heated to about 50° C. Reactant gas was bled into the etching chamber while it was continuously being pumped out to dynamically maintain a gas pressure of about 3.3 Pa in the etching chamber. Pressures of 1.33 Pa also have been used. The composition of the reactant gas was 93% by volume, nitrogen and 7% by volume, hydrogen.

After pressure in the chamber stabilized at the desired value, the rf power supply for the apparatus was turned on. It established a plasma adjacent the negative electrode and provided DC bias of about −250 volts on the negative electrode at a power density of about 0.33 watts per square centimeter of electrode surface. An etched pattern with a minimum feature size of approximately 1.25 micrometers was produced at an etch rate of about 100 angstroms per minute. Analogous results have been obtained with tin oxide films of other thicknesses and produced by other deposition techniques, as for example, pyrolytic deposition.

No significant tests have been made to determine the minimum proportion of hydrogen in the neutral gas that will produce etching of the tin oxide at a significant rate. On the other hand, it is presumed that even small amounts of hydrogen would be effective in causing etching of the tin oxide. However, the rate would be quite slow. Tests have shown that about 4 percent by volume hydrogen produce a significant tin oxide etch rate. Proportions of hydrogen in excess of about 10% are not desired. They are combustible and I prefer to avoid use of them. In addition, I am not sure they increase etch rate significantly. In fact, considerably larger proportions would probably decrease etch rate, because they reduce the gas mixtures proportion of sputtering atoms, that is, the heavier atoms such as nitrogen and/or argon.

In this connection, nitrogen and/or argon, as the base gas in the mixture provides momentum transfer in the etching process. Nitrogen and/or argon atoms bombard the substrate surface after it has been reduced by the hydrogen. Hence, the tin oxide is completely removed in one etching step. In some instances it may be preferred to use argon in place of nitrogen. In other cases it may be preferred to use a combination of the two. Whether nitrogen or argon are to be used alone or in combination as a base gas for the hydrogen may be a function of how they interact on the particular resist which has been selected as an etching mask, how they affect etching rate, how they affect selectivity, etc. In addition, it may even be desired to use other gases, as for example xenon, or krypton, instead of or in combination with nitrogen and/or argon.

The reactant gas of this invention has high selectivity in that it does not attack the resist anywhere nearly as fast as it does the tin oxide, or for that matter, the silicon oxide. Moreover, it only occasionally has been observed to polymerize, and cause attendant problems. Moreover, it is not corrosive on the vacuum system and is not toxic. On the other hand, it is not as fast an etchant as the silicon tetrachloride etchant of aforementioned covered by my concurrently filed United States patent application Ser. No. D-8546.

The embodiments of the invention in which an exclusive property or privilege is clamed are defined as follows:

1. In a method of reactive ion etching, the improvement wherein tin oxide is reactive ion etched using a neutral reactant gas containing minor proportions of hydrogen, whereby tin oxide is removed highly uniformly and without producing a residue that must be removed in a following step.

2. In a method of reactive ion etching, the improvement wherein a reactant gas containing from small but effective amounts to about 10 percent by volume hydrogen and the balance substantially at least one member selected from the group consisting of nitrogen and argon is used to etch a film of tin oxide, effective to produce high resolution patterns in the tin oxide film in one etching step.

3. A one-step process for the etching of high resolution patterns in tin oxide films comprising the step of reactively ion etching a tin oxide film with a reactant gas consisting essentially of at least one member selected from the group consisting of nitrogen and argon and about 4–10 percent by volume hydrogen.

4. The process of claim 3 wherein the reactant gas consists essentially nitrogen and the hydrogen content in the reactant gas is about 6–8 percent by volume.

5. The process of claim 3 wherein the reactant gas consists essentially of argon and the hydrogen content in the reactant gas is about 6–8 percent by volume.

* * * * *